US011136666B2

(12) United States Patent
Nasseri et al.

(10) Patent No.: US 11,136,666 B2
(45) Date of Patent: Oct. 5, 2021

(54) ORDERED NANOTUBES ON A TWO-DIMENSIONAL SUBSTRATE CONSISTING OF DIFFERENT MATERIAL PROPERTIES

(71) Applicant: University of Kentucky Research Foundation, Lexington, KY (US)

(72) Inventors: Mohsen Nasseri, Lexington, KY (US);
Armin Ansary, Lexington, KY (US);
Mathias J. Boland, Lexington, KY (US); Douglas R. Strachan, Lexington, KY (US)

(73) Assignee: University of Kentucky Research Foundation, Lexington, KY (US)

( * ) Notice: Subject to any disclaimer, the term of this patent is extended or adjusted under 35 U.S.C. 154(b) by 0 days.

(21) Appl. No.: 16/557,777

(22) Filed: Aug. 30, 2019

(65) Prior Publication Data
US 2020/0071817 A1 Mar. 5, 2020

Related U.S. Application Data

(60) Provisional application No. 62/724,832, filed on Aug. 30, 2018.

(51) Int. Cl.
*C23C 16/26* (2006.01)
*C23C 16/02* (2006.01)
*B32B 3/26* (2006.01)

(52) U.S. Cl.
CPC .......... *C23C 16/26* (2013.01); *C23C 16/0227* (2013.01); *B32B 3/26* (2013.01)

(58) Field of Classification Search
CPC ... C23C 16/26; C23C 16/0227; C23C 16/045; C23C 16/52; B82Y 40/00; B32B 3/26; B32B 3/30
See application file for complete search history.

(56) References Cited

U.S. PATENT DOCUMENTS

| 6,837,928 B1 | 1/2005 | Zhang et al. |
| 7,067,098 B2 | 6/2006 | Colbert et al. |
| 8,389,058 B2 | 3/2013 | Liu et al. |

(Continued)

FOREIGN PATENT DOCUMENTS

| CN | 105097575 A | 11/2015 |
| JP | 2016028012 A | 2/2016 |
| WO | WO2013013418 A1 | 1/2013 |

OTHER PUBLICATIONS

CN105097575—English machine translation of Abstract.
JP2016028012—English machine translation.
WO2013013418—English machine translation of Abstract.

*Primary Examiner* — Donald J Loney
(74) *Attorney, Agent, or Firm* — Stites & Harbison PLLC; Warren D. Schickli

(57) ABSTRACT

A nanoscale conductor/semiconductor/insulator device includes a substrate with a lattice and a plurality of nanotubes in crystallographic alignment with the lattice at an interface between the plurality of nanotubes and the substrate. Another such device includes a substrate, meandering tracks in the substrate and a plurality of nanotubes adhering to cut-atomic-step edges of the meandering tracks. Methods of making the nanoscale conductor/semiconductor/insulator devices are also disclosed.

4 Claims, 11 Drawing Sheets
(5 of 11 Drawing Sheet(s) Filed in Color)

(56) References Cited

U.S. PATENT DOCUMENTS

| | | |
|---|---|---|
| 8,759,824 B2 | 6/2014 | Dimitrakopoulos et al. |
| 8,981,345 B2 | 3/2015 | Yu et al. |
| 9,082,682 B2 | 7/2015 | Kim et al. |
| 9,263,254 B2 | 2/2016 | Wei et al. |
| 9,328,413 B2 | 5/2016 | Tang et al. |
| 9,570,294 B2 | 2/2017 | Wang et al. |
| 9,620,634 B2 | 4/2017 | Iannaccone et al. |
| 9,666,759 B2 | 5/2017 | Rho et al. |
| 9,793,214 B1 | 10/2017 | Venugopal et al. |
| 9,960,373 B2 | 5/2018 | Yoon et al. |
| 9,991,122 B2 | 6/2018 | Meade et al. |
| 10,181,521 B2 | 1/2019 | Venugopal et al. |
| 10,204,988 B2 | 2/2019 | Astley |
| 2003/0124717 A1* | 7/2003 | Awano ............ B82Y 40/00 435/287.2 |
| 2011/0163298 A1 | 7/2011 | Sung |
| 2011/0204020 A1* | 8/2011 | Ray ............ H01G 11/28 216/13 |
| 2012/0219881 A1* | 8/2012 | Sivarajan ............ H01M 8/0228 429/505 |
| 2013/0078424 A1 | 3/2013 | Ding et al. |
| 2013/0255567 A1* | 10/2013 | Wei ............ H01L 21/02658 117/106 |
| 2018/0158913 A1 | 6/2018 | Withers et al. |
| 2018/0197957 A1 | 7/2018 | Maeda et al. |

\* cited by examiner

FIG. 3a
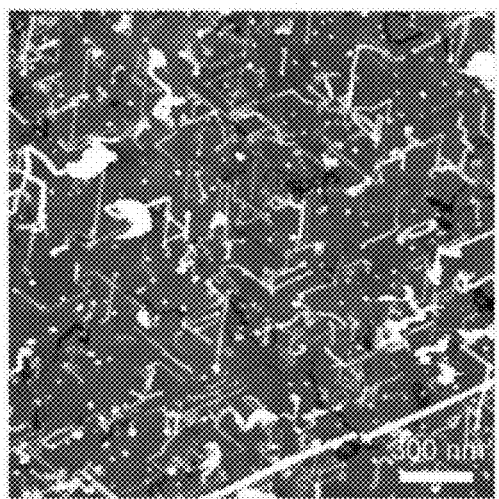
FIG. 3b
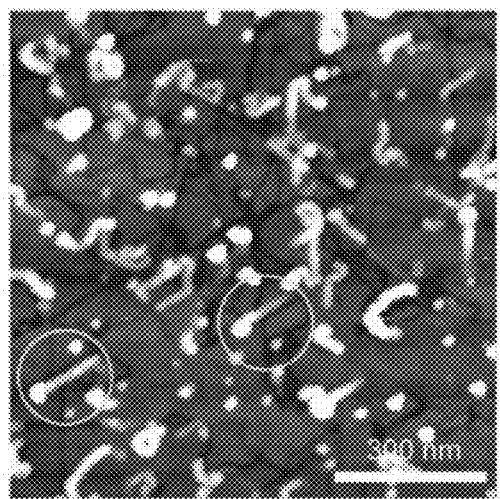
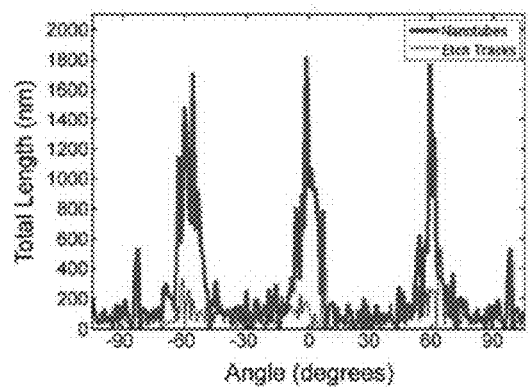
FIG. 3c
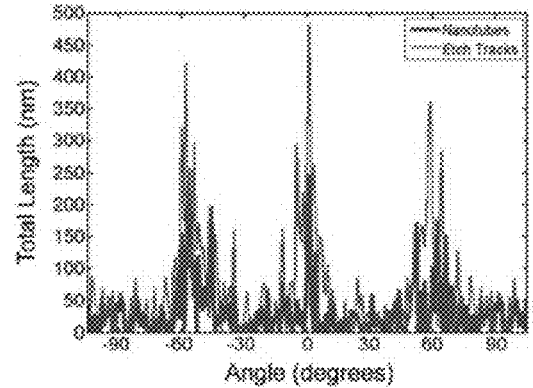
FIG. 3d

FIG. 5a
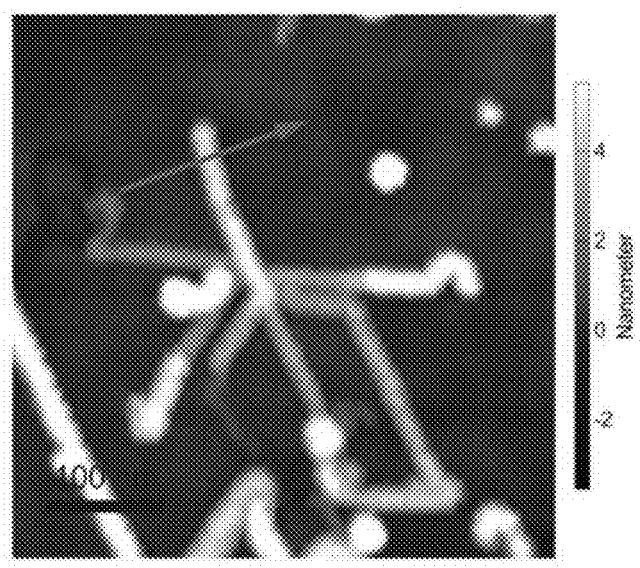
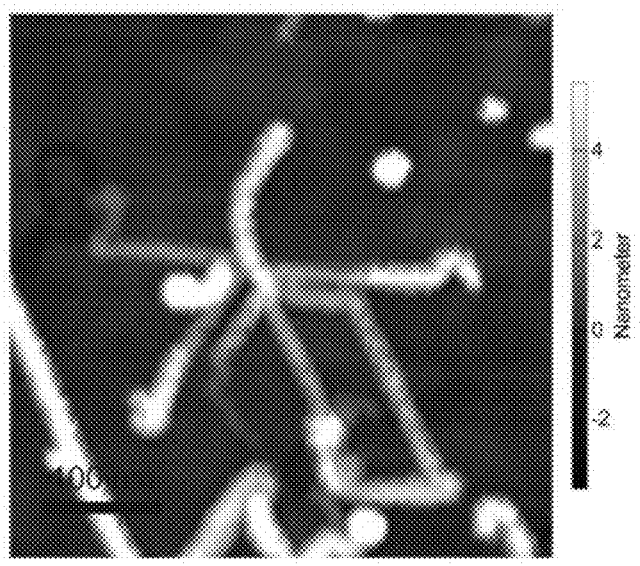
FIG. 5b

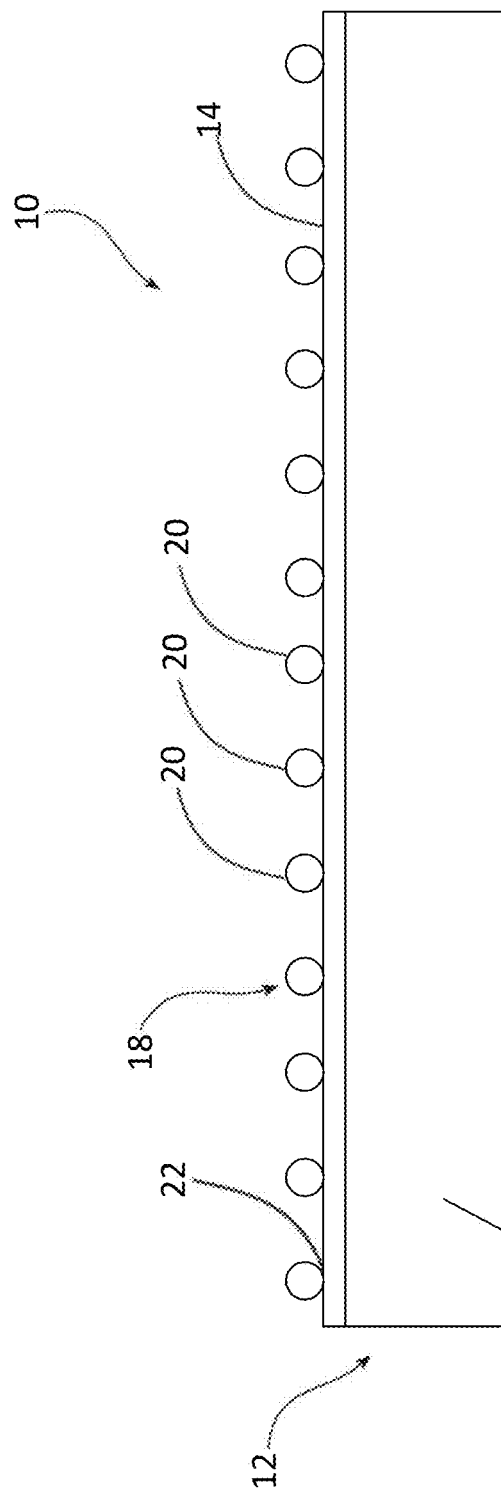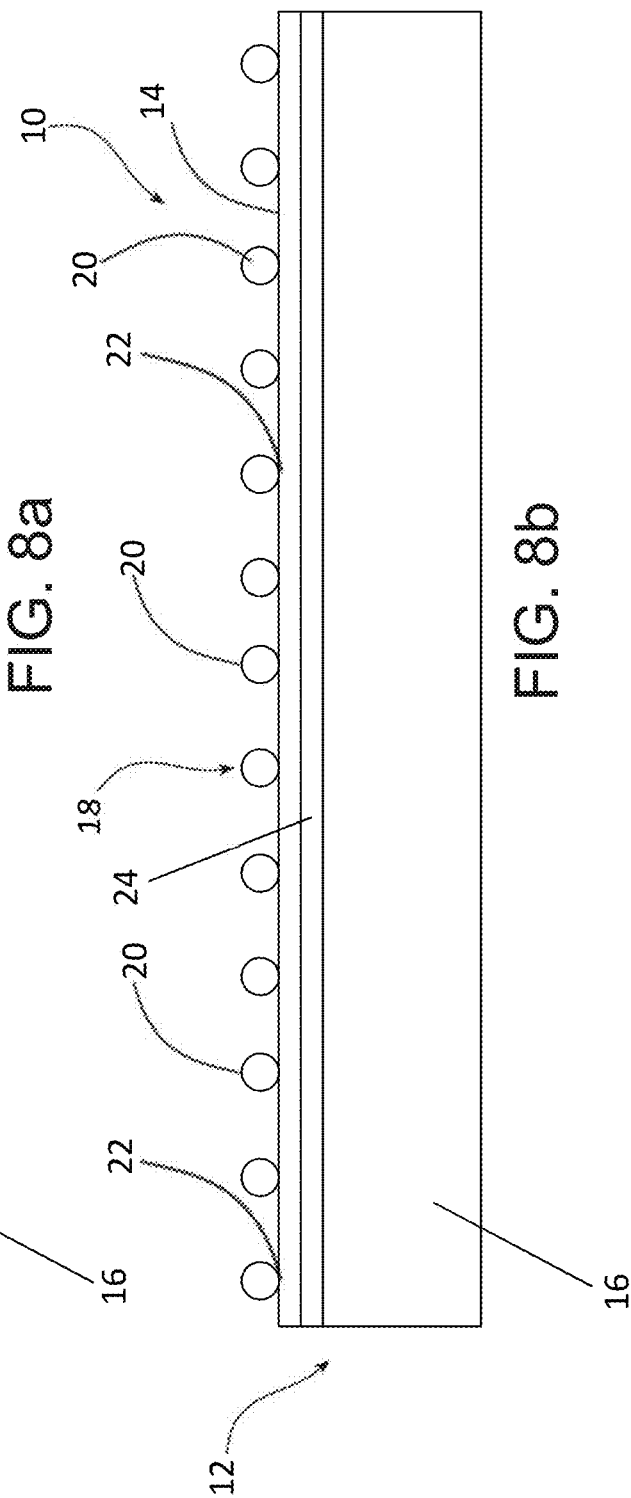

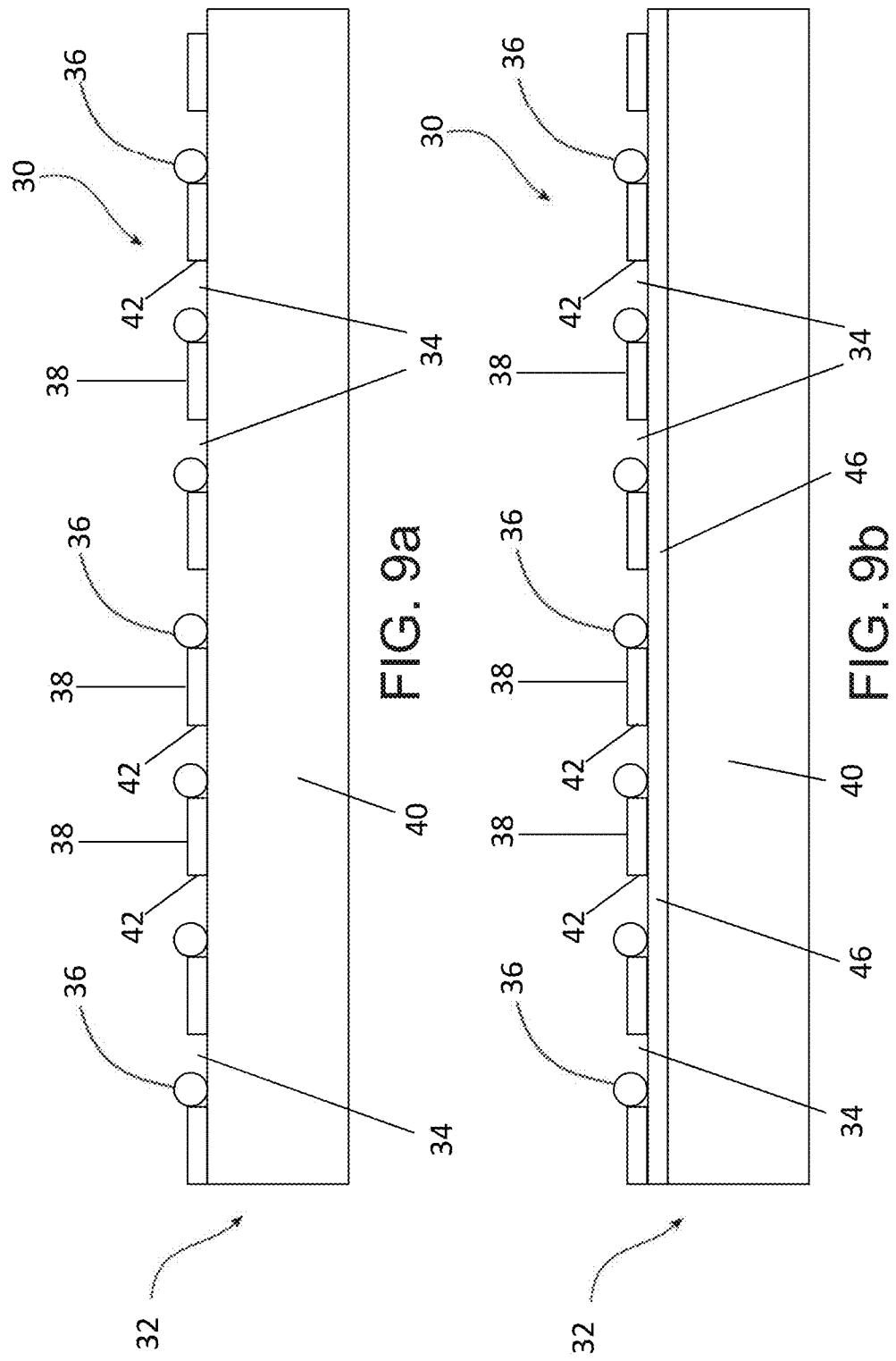

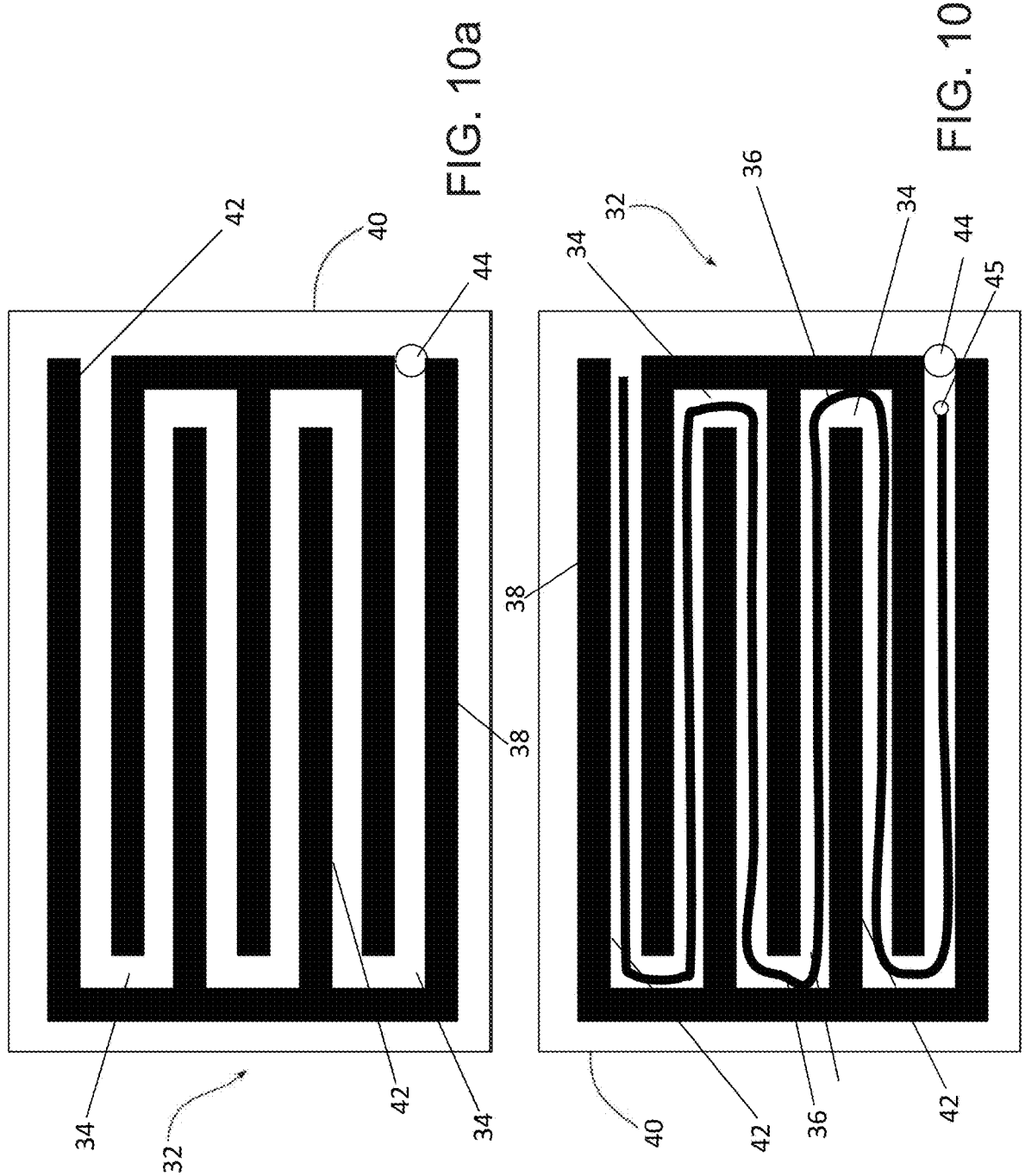

FIG. 11a
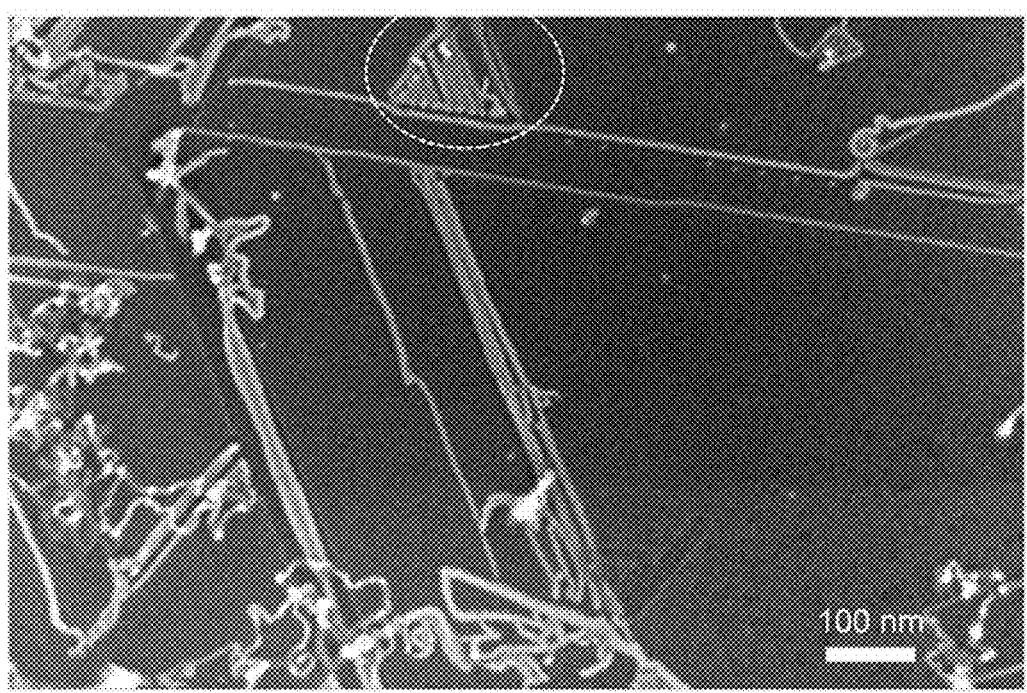
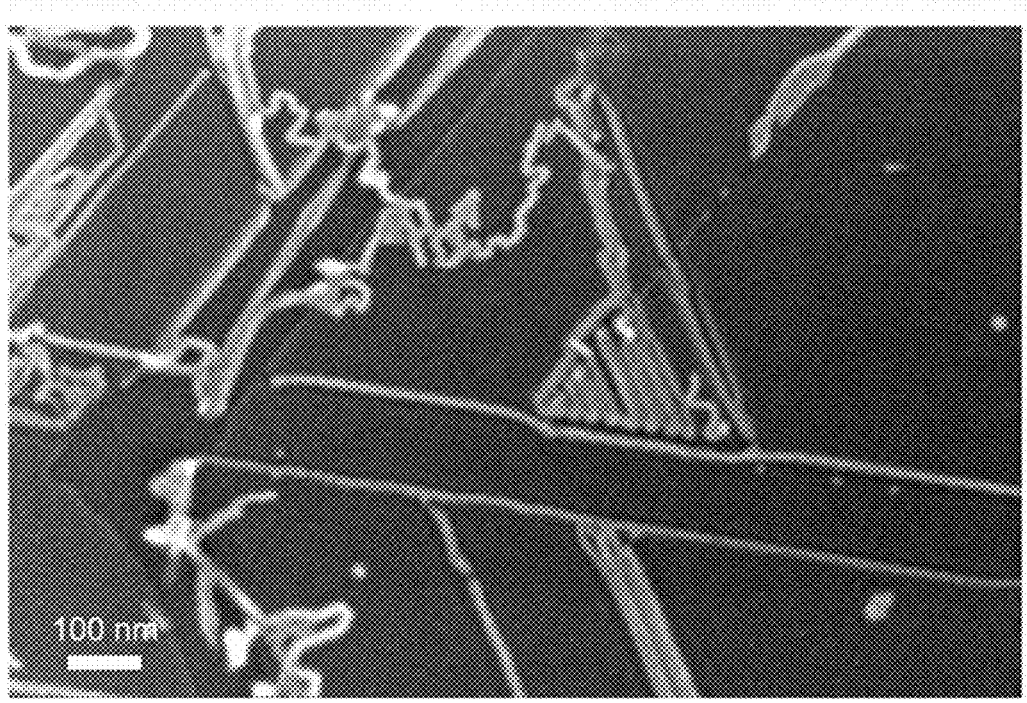
FIG. 11b

ORDERED NANOTUBES ON A TWO-DIMENSIONAL SUBSTRATE CONSISTING OF DIFFERENT MATERIAL PROPERTIES

RELATED APPLICATION

This application claims priority to U.S. Provisional Patent Application 62/724,832 filed on Aug. 30, 2018, which is hereby incorporated by reference in its entirety.

GOVERNMENT SUPPORT

This invention was made with government support under Grant No. 000022382 awarded by the Department of Energy and Grant No. 1603152 awarded by the National Science Foundation. The government has certain rights in the invention.

TECHNICAL FIELD

This document relates generally to the field of nanoscale conducting, semiconductor, and insulating devices and methods for making the same.

BACKGROUND

Nanotubes hold great promise in high-performance electronic components. One of the long-standing barriers to achieving much of this potential lies in the lack of control of the nanoscale ordered arrangement of the nanotubes. Towards achieving ordered arrangements, there has been progress in aligning nanotubes in parallel arrangements through a variety of different means. This includes the use of applied electric fields, directed gas flows, and single crystalline substrates. As the methods for synthesizing parallel nanotubes have improved, their density has significantly increased to the point where the inter-tube distances are on the order of only 10 nm. While this is a tremendous achievement in nanotube synthesis, an issue to contend with is the nanotube variability—specifically their chirality and diameters—since each nanotube is generally formed from separate catalyst particles. One ingenious way that researchers have circumvented the nanotube variation in parallel arrangements is to employ a synthesis of a single nanotube whereby it meanders back and forth in a "serpentine" arrangement—thus achieving parallel nanotubes of the exact same diameter and chirality. Unfortunately, the methods to synthesize serpentine nanotubes, which rely on a tuned competition between gas flow and interaction with a single-crystal substrate, result in parallel nanotube segments that are spaced on the scale of 10 microns—about a thousand times less dense than the best parallel growth methods of different nanotubes.

Here we disclose a serpentine nanotube synthesis resulting in ultra-high density parallel segments that is comparable to the most-dense arrangements ever made—on the order of 10 nm between the centers of the parallel segments of the nanotube.

We also disclose another method of simultaneously controlling the chirality of the nanotube (for purposes of this document, the term "nanotubes" also refers to nanowires) and its relative orientation with a substrate through lattice locking of two dissimilar materials at their interface. This method of locking two dissimilar materials is advantageous to attaining consistent highly-ordered crystallographic interfaces between nanotubes and underlying substrates amongst a large number of nanotubes.

SUMMARY

In accordance with the purposes and benefits described herein, a new and improved method is provided for making a nanoscale conductor/semiconductor/insulator device. That method includes the step of providing a first plurality of nanotubes (either conducting, semiconducting or insulating) on a substrate wherein the first plurality of nanotubes are in crystallographic alignment with a lattice of the substrate.

The method may include the steps of etching tracks in the substrate and adhering a second plurality of nanotubes (either conducting, semiconducting or insulating) to cut-atomic-step edges or trenches of the tracks in the substrate. The method may include the step of controlling orientation of the tracks on the substrate by providing a second substrate under the substrate into which the tracks are etched. The underlying second substrate may be made from a different material than the substrate being etched. The underlying second substrate may, for example, be made of single-crystal sapphire. The method may also include rotating the substrate with respect to a crystal orientation of the underlying second substrate to further control and tune the orientation of the tracks in the substrate.

The method may include the step of introducing strain into the substrate to energetically promote etching in the substrate along certain predetermined or desired directions. The method may include controlling location and size of a meander etch track region by introducing line defects within the substrate and etching the meander tracks between the line defects.

The tracks etched into the substrate may be meandering tracks and the second plurality of nanotubes may be serpentine nanotubes. For purposes of this document, "meandering tracks" means etch tracks that have parallel long segments connected by short ones such that the entire path has a multiple back-and-forth continuous "S" shape. For purposes of this document, "serpentine nanotubes" means nanotubes that have a multiple back-and-forth continuous "S" shape and (like the meandering tracks) have parallel long segments connected by short segments.

The substrate may be a 2-D material having relatively strong covalent bonds within a 2-dimensional sheet and relatively weak out of plane bonding between layers wherein the 2-D material is selected from a group consisting of dichalcogenides, hexagonal boron nitride, graphite, few layer graphene and heterostructure mixtures thereof.

In one or more of the many possible embodiments, the method may further include the step of using a deposition process to provide the first plurality of nanotubes on the substrate. That deposition process may be chemical vapor deposition.

In accordance with another aspect, a method for making a nanoscale conductor/semiconductor/insulator device includes the steps of: (a) etching at least one meandering track in a substrate and (b) adhering at least one serpentine nanotube (either conducting, semiconducting or insulating) to the cut-atomic-step edges or trenches of the at least one meandering track in the substrate.

The method may further include the step of selecting the substrate from a group of 2-D materials consisting of dichalcogenides, hexagonal boron nitride, graphite, few layer graphene and heterostructure mixtures thereof. The method may further include the step of depositing a catalytically-active material, such as a nickel film, on the substrate before growing the plurality of nanotubes on the substrate.

In accordance with yet another aspect, a method of making a nanoscale conductor/semiconductor/insulator device may comprise the steps of (a) exfoliating a substrate onto a support wafer and (b) growing a plurality of nanotubes (either conducting, semiconducting or insulating) on the substrate wherein the plurality of nanotubes are in crystallographic alignment with lattices of the substrate.

That method may further include the step of depositing a catalytically-active material, such as a nickel film, on the substrate before growing the plurality of nanotubes on the substrate. In addition, the method may include the step of growing the plurality of nanotubes on the substrate by a process selected from a group consisting of a chemical vapor deposition process in a vapor deposition chamber and/or a spin casting and deposition process through the use of liquids.

Still further, the method may include the steps of: (a) annealing the substrate in the vapor deposition chamber at a first predetermined temperature for a first predetermined period of time, (b) ramping up the temperature in the vapor deposition chamber from the first predetermined temperature to a predetermined temperature range, (c) introducing methane at a predetermined flow rate to the vapor deposition chamber when the vapor deposition chamber reaches the predetermined temperature range and (d) maintaining the vapor deposition chamber at a second predetermined temperature for a second predetermined period of time to promote the growing of the plurality of nanotubes on the substrate. Still further, the method may include etching tracks in a surface of the substrate and adhering at least some of the plurality of nanotubes to cut-atomic-step edges of the tracks.

In accordance with yet another aspect, a method of making a nanoscale conductor/semiconductor/insulator device comprises the steps of: (a) exfoliating a substrate onto a support wafer, (b) etching meandering tracks in a surface of the substrate and (c) adhering a plurality of serpentine nanotubes (either conducting, semiconducting or insulating) to cut-atomic-step edges or trenches of the meandering tracks.

In accordance with yet another aspect, a new and improved nanoscale conductor/semiconductor/insulator device is provided. That device comprises: a substrate, meandering tracks in the substrate and a plurality of nanotubes (either conducting, semiconducting or insulating) adhering to the cut-atomic-step edges of the meandering tracks.

The substrate may be selected from a group of 2-D materials consisting of dichalcogenides, hexagonal boron nitride, graphite, few layer graphene and heterostructure mixtures thereof. Still further, the device may include at least one track etched into the surface of the substrate and at least some of the plurality of nanotubes adhering to cut-atomic-step edges and trenches of the at least one track.

In accordance with still another aspect, a nanoscale conductor/semiconductor/insulator device comprises: a substrate, meandering tracks in the substrate and a plurality of serpentine nanotubes (either conducting, semiconducting or insulating) adhering to cut-atomic edges or trenches of the meandering tracks. The substrate may be selected from a group of 2-D materials consisting of dichalcogenides, hexagonal boron nitride, graphite, few layer graphene and heterostructure mixtures thereof. The plurality of serpentine nanotubes may be crystallographically aligned with the underlying substrate including either the substrate layer into which the meander track has been etched or another substrate layer underlying the etched layer.

In the following description, there are shown and described several preferred embodiments of the method and nanoscale conductor/semiconductor/insulator device. As it should be realized, the method and nanoscale device are capable of other, different embodiments and their several details are capable of modification in various, obvious aspects all without departing from the method and the nanoscale device as set forth and described in the following claims. Accordingly, the drawings and descriptions should be regarded as illustrative in nature and not as restrictive.

BRIEF DESCRIPTION OF THE DRAWING FIGURES

The patent or application file contains at least one drawing executed in color. Copies of this patent or patent application publication with color drawing(s) will be provided by the Office upon request and payment of the necessary fee.

The accompanying drawing figures incorporated herein and forming a part of the specification, illustrate several aspects of the semiconductor device and the methods of making the same and together with the description serve to explain certain principles thereof.

FIGS. 1a-1d illustrate nanotubes grown on an hBN film. FIG. 1a is an atomic force microscopy (AFM) image of the nanotubes grown on the few-layer hBN film. Most of the white lines on the hBN flake are nanotubes (pointed to by the solid-red arrow) with some additional star-like defects within the hBN film itself (pointed to by the dashed-green arrow) that are also apparent. An etch track is pointed to by the dotted-yellow arrow. FIG. 1b is an enlarged AFM image showing details of the nanotubes grown on the hBN surface within the dashed red square region in FIG. 1a. A nanotube is pointed to with a solid-red arrow, while two other nanotubes that make a zig-zag growth pattern are circled. FIG. 1c illustrates an AFM topographic line-scan of the nanotubes on hBN made along the dashed-red line in FIG. 1a showing the diameters (taken as the topographic height increase) of the nanotubes. FIG. 1d is a histogram of the diameters of nanotubes grown on hBN measured with AFM topographic line-scans, like the one in FIG. 1c.

FIGS. 2a-2b illustrate crystallographic orientation of nanotubes grown on hBN films. FIG. 2a is a histogram of the total length of all nanotubes as a function of angle for the nanotubes in FIG. 1a. FIG. 2b is a histogram of nanotube count as a function of straight segment length within four-degree windows around the peaks in FIG. 2a.

FIGS. 3a-3d show a comparison of nanotube and etch track orientations and alignments. FIG. 3a is an AFM topographic image of a flake from sample MNhBN-01 showing nanotubes grown with a low (25 sccm) $CH_4$ feedstock flow over most of the temperature ramp (starting at 650° C.) that inhibits etching. FIG. 3b is an AFM image of a flake from sample AAhBN-03 showing nanotubes grown with a high (100 sccm) $CH_4$ feedstock flow only after reaching the growth temperature (980° C.) showing greater etching and less alignment of the nanotubes. Two nanotubes that are aligned to etch tracks are circled. FIG. 3c is a histogram of the total length of nanotubes and etch tracks for the image in FIG. 3a. This histogram shows that the nanotubes show strong alignment to the underlying hBN lattice despite the fact that there do not exist large quantities of aligned etch tracks. FIG. 3d is a similar histogram made of the image in FIG. 3b showing a flipped tendency for alignment; i.e., having better alignment of etch tracks than nanotubes. (The scale bars in FIGS. 3a and 3b of this figure are both 300 nm in length.)

FIGS. 4a-4d illustrate Raman spectra of nanotubes on hBN samples. FIG. 4a illustrates a Raman spectrum obtained from the sample in FIG. 1a consisting of hBN with grown nanotubes. The $E_{2g}$ peak of hBN and the G peak of carbon nanotubes (CNTs) are located at ~1365 cm$^{-1}$ and ~1600 cm$^{-1}$ respectively for this sample. FIG. 4b illustrates the Raman spectrum obtained from a pristine hBN flake. FIGS. 4c-4d illustrates the Raman spectra for double walled CNTs randomly deposited out of solution onto hBN flakes. As the coverage of CNTs on BN increases in going from FIG. 4c to FIG. 4d, there is a marked increase in detector counts and improved signal/noise. Moreover, as the CNT coverage increases, the D (~1250 cm$^{-1}$), G (~1600 cm$^{-1}$), and 2D (~2620 cm$^{-1}$) peaks associated with sp$^2$ carbon become much more pronounced in comparison to the hBN signal. All spectra were taken with an incident laser wavelength of 633 nm with background subtraction. The counts/second (cps) were obtained by averaging over integration periods of 800 seconds for the spectrum shown in FIG. 4a and 600 seconds for the spectra shown in FIGS. 4b-4d.

FIGS. 5a and 5b illustrate nanoscale manipulation of CNTs grown on hBN. FIG. 5a illustrates an initial AFM topographic image of crystallographically-oriented CNTs on hBN. After the AFM scan was made, the tip was dragged on the surface with a constant normal load of ~15 nN. FIG. 5b is an AFM image of the same region showing the results after the nano-manipulation was performed.

FIGS. 6a-6d illustrate two-probe conducting-tip measurements of electrical transport of CNTs grown on hBN. FIG. 6a is an AFM image of a Ti/Au electrode lithographically placed onto a portion of CNTs grown on hBN. The CNTs can be seen in this image as the white lines on the hBN surface. FIG. 6b is a schematic of electrical transport measurements, where a conducting tip is used to form the second electrode. FIG. 6c illustrates the reference conductance of the tip placed in direct contact with the Ti/Au electrode. FIG. 6d illustrates two-probe current-voltage measurements (red-square data points) of a CNT measured by placing the conducting tip in contact with a nanotube in the region circled by the red dashed line in FIG. 6a. When the tip dislodges and is in contact with the nearby hBN substrate, the conductance and current falls abruptly to the blue-circular data points.

FIGS. 7a-7f illustrate detection of electrical conduction of CNTs on hBN through electrostatic force microscopy measurements (EFM). FIG. 7a shows the topography of the region within the solid-blue box in FIG. 6a investigated with EFM. FIG. 7b is an EFM image of the same area as in FIG. 7a with −7 volts applied to the tip relative the grounded conducting back-plane of the substrate showing a contrasting signal of the CNTs grown on hBN. FIG. 7c is an EFM image of the same area as in FIG. 7a with +7 volts applied to the tip relative the grounded conducting back-plane of the substrate, showing a slight contrast in the signal of the CNTs on hBN. FIG. 7d is an EFM analysis of measurements of a region over the bare hBN (the thin-blue box in FIG. 7a) and over a CNT (the thick-red box in FIG. 7a) with signals averaged over the respective boxes. In both regions the EFM signal shows a parabolic phase as a function of tip voltage, indicative of a capacitive signal. FIG. 7e illustrates plotting the difference in the EFM signals shows that over the CNTs, the phase shift is consistently greater, particularly for negative tip voltages. Measurement 1 was performed with a new sharp conducting tip, while the second set of measurements (Measurement 2) was performed with the same tip after it had been worn. FIG. 7f shows a capacitive model that accounts for the increased phase shift over the CNTs due to the increased capacitive coupling due to their electrical conduction.

FIG. 8a is a schematic cross sectional view of a first possible embodiment of a nanoscale device wherein a plurality of nanotubes are in crystallographic alignment with a lattice of a substrate at the interface of the nanotubes and the substrate.

FIG. 8b is a schematic cross sectional view of a second embodiment of a nanoscale device that differs from the nanoscale device illustrated in FIG. 9a by having a substrate incorporating a third, intermediate layer.

FIG. 9a is a schematic cross sectional view of an additional embodiment of a nanoscale device wherein a plurality of nanotubes adhere to cut-atomic-step edges or trenches of meandering tracks etched into a surface of a substrate.

FIG. 9b is a schematic cross sectional view of yet another embodiment of nanoscale device that differs from the nanoscale device illustrated in FIG. 9a by having a substrate incorporating a third, intermediate layer.

FIG. 10a is a top plan view of a substrate illustrating the meandering track cut into the substrate by a catalytic particle.

FIG. 10b is a view of the meandering track illustrated in FIG. 10a after a serpentine nanotube has been grown in that meandering track.

Figure 1A:
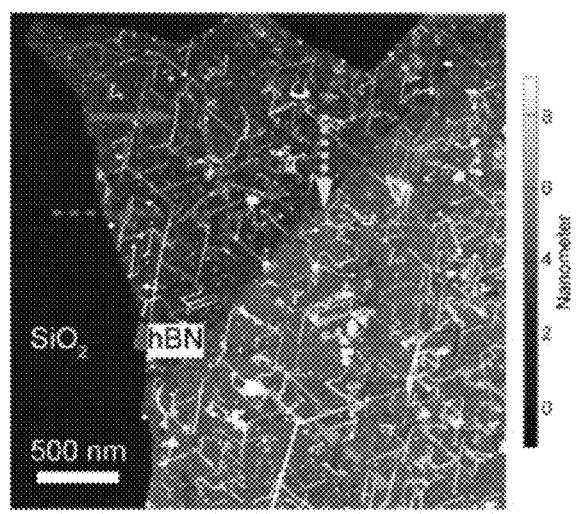

FIG. 11a is a top view of a catalytically etched surface of graphite with nanotubes grown along the etched step edges and trenches. In FIG. 11a the faint white lines are etched steps on a graphite surface. The brighter white lines are nanotubes grown along these etched steps. An etch formation can occur on the surfaces of 2-D materials which shows a meandering pattern. This meandering pattern can then be transferred to nanotubes which preferentially grow along the etched step edges and/or within the trenches through adhesive forces. This results in a "serpentine" growth structure for the nanotube, circled in FIG. 11a.

FIG. 11b is a close-up of that same region, where the tube-tube distance is measured (from center to center) to be approximately 11 nm. This is an approximately ~1000 fold increase in density over the previous best reports in the literature for attaining serpentine nanotubes.

Reference will now be made in detail to the present preferred embodiments of the method and materials for performing that method, examples of which are illustrated in the accompanying drawing figures.

DETAILED DESCRIPTION

Reference is now made to FIG. 8a which schematically illustrates a first embodiment of a nanoscale conductor/semiconductor/insulator device 10. The nanoscale device 10 includes a substrate 12 having a 2-D material layer 14 and an underlying bulk substrate layer 16. Bulk substrate layer 16 may be single crystal or glass support. That 2-D material layer 14 has relatively strong covalent bonds within a 2-dimensional sheet and relatively weak out of plane bonding between layers. Such 2-D materials include, but are not necessarily limited to, dichalcogenides, hexagonal boron nitride, graphite, few-layer graphene, like or similar materials and heterostructure mixtures thereof. That 2-D material also has at least one lattice 18. The illustrated lattice 18 runs perpendicular to the plane of the two dimensional drawing figure.

The nanoscale device 10 also includes a plurality of nanotubes 20 (either conducting, semiconducting or insulating) in crystallographic alignment with the lattice 18 at an interface 22 between the plurality of nanotubes and the 2-D material layer 14 of the substrate 12. The nanotubes 20 may be carbon nanotubes or nanotubes or nanowires made from any other appropriate material. For purpose of this document, such an appropriate material may have very different conducting properties but would also have a similar underlying lattice to that of the substrate. More particularly, in one possible embodiment, the lattices of the nanotubes and the substrate would have less than a 10% lattice mismatch. In another possible embodiment, the lattices of the nanotubes and the substrate would have less than a 5% lattice mismatch. In yet another possible embodiment, the lattices of the nanotubes and the substrate would have less than a 2% lattice mismatch.

FIG. 8b schematically illustrates another embodiment of the nanoscale device 10 identical to the embodiment illustrated in FIG. 8a except that the substrate 12 also includes an intermediate 2-D material layer 24 between the 2-D material layer 14 supporting the nanotubes 20 and the underlying bulk substrate layer 16.

Reference is now made to FIG. 9a illustrating a second possible embodiment of a nanoscale conductor/semiconductor/insulator device 30 including the substrate 32, a meandering track 34 in the substrate and a serpentine nanotube 36 (either conducting, semiconducting or insulating) in that meandering track. More particularly, the substrate 32 includes a 2-D material layer 38 into which the meandering track 34 is etched and an underlying bulk substrate layer 40. The meandering track 34 includes cut-atomic-step edges and trenches 42 and the serpentine nanotube 36 adheres to the cut-atomic-step edge and trench. The nanotube 36 may be a carbon nanotube or a nanotube made from another material capable of adhering to the cut-atomic-step edges and trench 42 of the meandering track 34 etched into the 2-D material layer 38 of the substrate 32.

FIG. 10a is a top plan view illustrating the shape of the meandering track 34 etched into the 2-D material layer 38 on the bulk substrate layer 40. The catalyst particle 44 that etched the track is shown at the lower right of FIG. 10a. FIG. 10b is a view similar to FIG. 10a but further illustrating the serpentine nanotube 36 that is grown or deposited into the meandering track 34. The catalyst particle 45 that grew that nanotube is illustrated at the lower right of FIG. 10b.

FIG. 9b schematically illustrates another embodiment of the nanoscale device 30 identical to the embodiment illustrated in FIG. 9a except that the substrate 32 also includes an intermediate 2-D material layer 46 between the etched 2-D material layer 36 and the underlying bulk substrate layer 40.

While various embodiments of nanoscale devices 10, 30 are illustrated in FIGS. 8a, 8b, 9a and 9b on the same substrate 12, it should be appreciated that a substrate may only include the structure of the nanoscale device 10 illustrated in FIG. 8a or 8b or alternatively only include the structure of the nanoscale device 30 illustrated in FIG. 9a or 9b.

A method of making the nanoscale device 10 illustrated in FIG. 8a or 8b may simply include the step of providing a first plurality of nanotubes 20 on the substrate 12 with the first plurality of nanotubes in crystallographic alignment with the lattice 18 of the substrate. In order to make the nanoscale device 30 illustrated in FIG. 9a or 9b, the method includes the step of etching tracks 22 in the substrate 12 and adhering a second plurality of nanotubes 36 (either conducting, semiconducting or insulating) to cut-atomic-step edges or trenches 26 of the tracks in the substrate.

Still further, the method may include providing meandering tracks 22 and the second plurality of nanotubes (again either conducting, semiconducting or insulating) may be serpentine nanotubes. Further, a deposition process may be used to provide the first and the second plurality of nanotubes 20, 36 on the substrate 12. That deposition process may be chemical vapor deposition.

With regard to the nanoscale device 10 illustrated in FIG. 8a or 8b, a crystallographic interface 22 is provided between the first plurality of nanotubes or nanowires 20 and the underlying substrate (either 2-D or 3-D) 12. The use of a 2-D material for the substrate 12 is advantageous because it provides minimal out-of-plane bonding that can disrupt the perfection of the aligned nanotubes 16. The use of a 2-D material also allows for the possibility to tune the bonding energy of the nanotube 20 to its surface through the use of another underlying substrate or additional 2-D material (and heterostructures consisting of these) below it.

A crystallographically-aligned interface 22 is defined by a plurality of nanotubes 16 having a common crystal orientation with respect to their axis (also referred to as having a common chirality for nanotubes). If these nanotubes 16 are then oriented on a common crystal surface with the same physical orientation (or other orientations sharing the same crystal symmetry), then the interface is termed crystallographic amongst all the nanotubes or nanowires 20.

Such crystallographic interfaces 18 can themselves show crystallographic symmetry either through a perfect spatial periodicity of all the atoms (termed a Bravais lattice) or showing a spatial periodicity for the average overlap density of atoms of the adjacent atoms on the surface. In this case, the interface 22 is not strictly a Bravais lattice, but the interface still retains many of the long-range aspects of such a lattice—principally the Moiré lattice effect.

The benefits of crystallographic orientation of nanotubes/nanowires 20 on a substrate 12 are: (a) consistent interfacial effects and modifications to the nanotubes and nanowires, (b) reduced defects at the interfaces 18, yielding better device performances, (c) ordered arrangements of nanotubes and nanowires, and (d) consistent modified behavior of the nanotubes and nanowires—such as increased/decreased band gaps, different effective masses to carriers, magnetic effects, and superconducting effects.

The formation of such crystallographic interfaces 18 requires a variation in the binding energy of the nanotube or nanowire 20 with its orientation on the 2-D material or substrate 12 below it. This orientational energy profile helps to promote the growth or placement of the nanotubes and nanowires along preferred directions. This orientational energy profile promotes certain specific crystal structures and chiralities of the nanotubes and nanowires. Thus, with both of the orientation and crystal structure of the nanotubes/nanowires being controlled, the resulting growth is crystallographic.

With regard to the structure illustrated in FIGS. 9a, 9b and 10b, nanotubes 36 aligned to the etch tracks 22 on the surface of an underlying 2-D material substrate 12 may include the formation of the etched tracks 22 on the 2-D surface of the substrate 12. This requires a high enough chemical vapor deposition (CVD) processing temperature in order to yield the catalytic etching of the top few layers of the 2-D material substrate. After formation of the etch tracks 22, it requires the growth or placement of nanotubes 36 along these etch tracks.

Growth of nanotubes can be achieved either in situ (in the same furnace processing run) or ex situ (after the etched 2-D material substrate 12 is removed from the chamber).

In Situ:

This formation of nanotubes 36 uses a chemical vapor deposition growth that exists concurrently with the etching, or after the etching is performed. For concurrent formation, the chamber parameters are identical to those for etching. For post-etching growth, the parameters for nanotube or nanowire growth are different to those for etching the 2-D material. The two parameters that can be changed are the applied gas flow and the furnace temperature. For example, to achieve the etching of hBN, one can use an initial $H_2$ and Ar gas flow. After this, the introduction of a carbon containing gas, such as $CH_4$, and the raising or lowering of the temperature can trigger the growth of nanotubes 36 that can align to the etch tracks 22.

Ex Situ:

This allows for the etched 2-D material substrate 12 to be removed from the furnace and then an alternative deposition or growth can be used to achieve the aligned nanotubes 36 onto its surface. The second deposition or growth step could be another CVD furnace run, and could also have very different conditions to the furnace run used to produce the etch tracks 22. The second step of depositing nanowires and nanotubes 36 could be very different from the initial CVD etch formation. Such methods include (but are not limited to): (a) drop cast of nanowires or nanotubes 36 in solution, and (b) spin casting of nanowires or nanotubes in polymers matrices or in solution.

Control of the orientation of the etch tracks 22 determines control in the orientation of the nanotubes 36. The etch tracks 22 can be controlled for thinner 2-D layers via coupling to an additional substrate material below it, such as single-crystal sapphire. Another alternative is to use a heterostructure or another 2-D material below the top few layers of the 2-D material to be etched. These lower layers can introduce strain and energetically promote etching in the top few layers along certain specific directions. This system can be further tuned by rotating the top few layers (that will be etched) with respect to the crystal orientation of the underlying layers or substrate.

It is also possible to provide high-density serpentine nanotubes 36 aligned to the meander etch tracks 22 on the surface of a 2-D or 3-D material substrate 12. These method steps are the same as those described above, except they require considerably more etching and much longer nanotubes such that the following two criteria are met.

First, the etching must be sufficient to yield an approximately 10 nm (pitch) back-and-forth arrangement of etch tracks 22. This ultra-high density of the meander track 22 is achieved through the natural self-aligned formation of the etching process. This natural alignment yields incredibly precise and intricate meander arrangements.

Second, the nanotubes 36 grown must be long enough to follow along the along the contours of the meander etch track. Inhibiting the spoiling of the catalyst particle during the nanotube growth is one well-known method for achieving very long nanotubes sufficient to follow along the contours of the meander etch track. This can be done by carefully tuning the amount of feedstock gas supplied. This can also be achieved through the introduction of water into the CVD chamber, which tends to reduce the tendency for the catalyst particles to become spoilt. In addition, this can also be achieved by introducing oxygen into the environment, or using special catalyst particle (combinations of materials) or feedstock gases.

The structures illustrated in (a) FIGS. 8a and 8b and (b) FIGS. 9a, 9b, 10a and 10b differ in several ways. Crystallographic nanotubes/nanowires 20 on a 2-D material as illustrated in FIGS. 8a and 8b do not require the etching processing. Crystallographic nanotubes and nanowires 20 on a surface all have a common crystal structure and/or chirality. In contrast, nanotubes 36 aligned along etch tracks 22 may or may not have the same crystal and/or chiral structure.

Graphite etching occurs at any temperature above 700° C. because of hydrogenation. The role of hydrogen is very important and hydrogen needs to be present in the CVD. Etching may be performed at atmospheric pressure with flow of Ar carrier gas (that acts to deliver the $H_2$ and the feedstock gas). The flow rates of Ar may be between 800 sccm and 1000 sccm.

The required temperature range for etching graphite is between 700° C. and 1100° C. or possibly higher. The longer the CVD processing time the more graphite etching is observed. The time required for etching is highly dependent on the temperature. At high temperature (e.g. 1000° C.) 30 min is enough to have significant etching and meander tracks on the flakes. At low temperature (e.g. 700° C.) a 30 min CVD runs results in just a few etch tracks on the flakes without meander tracks.

Typically, a 0.02 nm nominal thickness film of Ni (the catalyst material) is deposited on the surface of the substrate. This Ni film forms the catalyst particles and both etches the 2-D material surface and grows the nanotubes. In general, different catalyst particles could be used for these two processing steps, although in our current synthesis, we just use the same catalyst particles. Whether the catalyst particle is active in etching or nanotube growth depends on its location within the sample. Catalyst particles close to edges tend to etch, whereas catalyst particles on the surface of the 2-D material tend to grow nanotubes.

Etching of hexagonal boron nitride (hBN) is similar to graphite and occurs at any temperature above 700° C. The best crystallographic result appears to occur at roughly 900° C. (i.e. between 850° C. and 950° C. Compared to graphene the 1D etching is less aggressive on hBN—i.e., occurs to lesser extent (shorter etch tracks).

The parameters to etch meander tracks in a substrate of graphite are similar to simple etching of graphite, except that the temperature needs to be slightly higher—above about 900° C. The meander etch pattern tends to form when a catalyst particle becomes bound between two line defects (such as the edges of a crystalline flake or other etch tracks). The catalyst particle etches back and forth between the two line defects forming a track that meanders back and forth. By controlling the placement and introduction of line defects within a sample, it is possible to control the location and size of these meander etch track regions. However, the pitch (the distance between the centers of adjacent track legs within a meander structure) appears to be a product of short-range interactions within the etched film. That is, the small-scale features of the meander etch-track are "self-aligned", and thus have a precision and uniformity far exceeding the capabilities of other nanoscale fabrication and processing techniques.

Line defects may be introduced in a substrate in a number of ways including, for example, by utilizing the boundaries of single-crystalline flake of material, by lithographically defining defects or boundaries and by scribing or cutting the surface with a scanning probe tip or beam.

Growing carbon nanotubes (CNTs) on hBN is similar to growing CNTs on graphene. The critical parameters are temperature, feedstock, and hydrogen partial pressure and flow rate (see details below). To achieve CNTs on hBN it is possible to follow two different recipes that differed by whether $CH_4$ was introduced into the CVD chamber at either high or low temperatures. For purposes of this document, "low temperature" is achieved before reaching the CNT growth temperature and is any temperature below 800° C. "High temperature" refers to a temperature in which $CH_4$ is introduced and the temperature required for CNT growth reached (in this case typically in the range of 960-990° C.). In general, introducing $CH_4$ at lower (higher) temperature resulted in less (more) etching and longer (shorter) CNTs.

With respect to CVD parameters and procedures, initially the samples may be annealed at 500° C. for 30 min with gas flow $Ar/H_2$ with rates of 800/200 sccm. After this first step the temperature may be raised at a rate of ~25-50° C./min. The furnace may then be heated to a temperature of 960-990° C. for 60-120 min to promote CNT growth. $CH_4$ with various flow rates (15-200 sccm) is introduced into the CVD system when the temperature is between 580 and 990° C.

Growing CNTs on graphite, graphene, and hBN with the use of feedstock is very similar. The main difference being that for the case of growth on hBN, an applied carbon-containing gas feedstock, like $CH_4$, is required. This is due to the fact that hBN itself does not contain carbon, and cannot also act as a feedstock source for CNT production.

Short CNTs on graphite that align to etched edges or within etch trenches appear to grow on graphite samples when a $CH_4$ feedstock is not used. The resulting lack of continuous and consistent feedstock of hydrocarbon may lead to the growth of CNTs of variable length. Short CNTs on graphite that align to etched edges also appear to grow on samples with high $CH_4$ flow (i.e. a flow rate above about 80 sccm). High $CH_4$ flow causes supersaturation of catalyst particles, thus inhibiting their growth.

Long CNTs on graphite that can follow meander etch directions to form high-density serpentines are more likely to grow under certain conditions. More specifically, water and oxygen appear to be important parameters to enhance the lifetime of the catalyst particle by cleaning the surface of nanoparticles. Water-assisted CVD and oxygen (Oz), and oxygen containing precursors such as CO, $C_2H_5OH$, $CO_2$, and many other species is possible and may be used to promote the growth of long CNTs on graphite.

The combination of two metal elements (e.g. Fe and Al) used as catalyst particles for growing nanotubes may also result in having long CNTs.

EXAMPLE

To grow the aligned CNTs we begin by depositing Ni catalyst onto clean exfoliated hexagonal boron nitride (hBN) flakes placed on $SiO_2$ substrates (see Experimental Section for details). Using a one-inch tube-furnace CVD system near atmospheric pressures, we perform a two-stage process for growing the CNTs on hBN. Under a gas flow of 800 sccm Ar and 200 sccm $H_2$, the samples are first raised to a preforming temperature of 500° C. for 30 min, and then raised at a rate of ~25-50° C./min to a CNT growth temperature between 960 and 990° C. for 60-120 min followed by cooling to room temperature under gas flow prior to removal. $CH_4$ is introduced at various stages during the CVD processing with a flow rate between of 15 and 200 sccm. Overall, for 10 CVD growth attempts having various $CH_4$ processing conditions, we have obtained seven wafers with evidence of CNTs grown on the hBN.

Figure 1B:
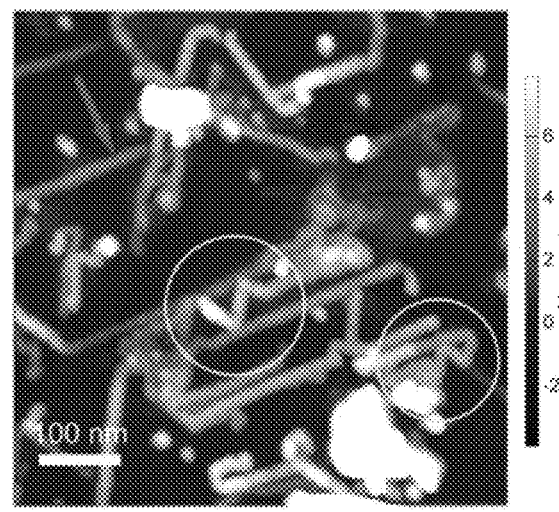

FIG. 1a shows an atomic force microscopy (AFM) image of an hBN flake on one such sample (we denote as "MNhBN-01") on which nanotubes have been grown using a 25 sccm $CH_4$ feedstock application that was initiated at 650° C. during the ramp up to the final growth temperature of 980° C. The AFM image of the processed hBN flake has a number of white lines (pointed to by the solid-red arrows in FIG. 1a and the enlarged image in FIG. 1b), the majority of which we identify as CNTs (supported by our analysis below). As is clear from the AFM images, such CNTs tend to align along preferred directions of the hBN lattice. The zig-zag pattern of several of the grown CNTs (shown circled in FIG. 1b) that seem to reflect off of other nanotubes suggests a tip growth process. In addition to these nanotubes, we also observe some star-like defects that radiate from single points in the hBN flake, like the one pointed to by the dashed-green arrow in FIG. 1a. These star defects are also crystallographically-oriented to the hBN lattice, like the nanotubes, and commonly occur for CVD processed hBN. The CVD processing also results in various amounts of catalytic etching, as pointed to by the dotted-yellow arrow in FIG. 1a, that depends on the details of the $CH_4$ feedstock application, as discussed in detail below.

Figure 1C:
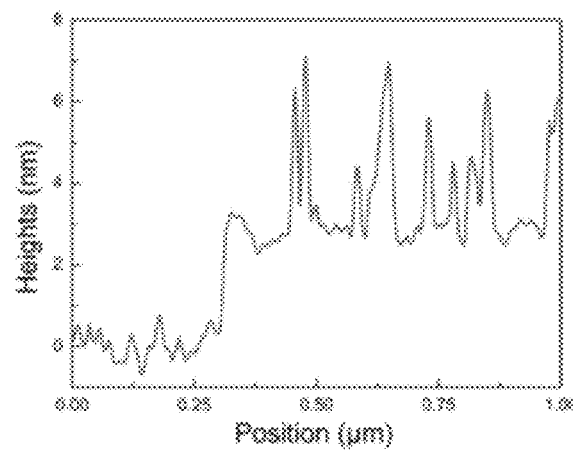
Figure 1D:
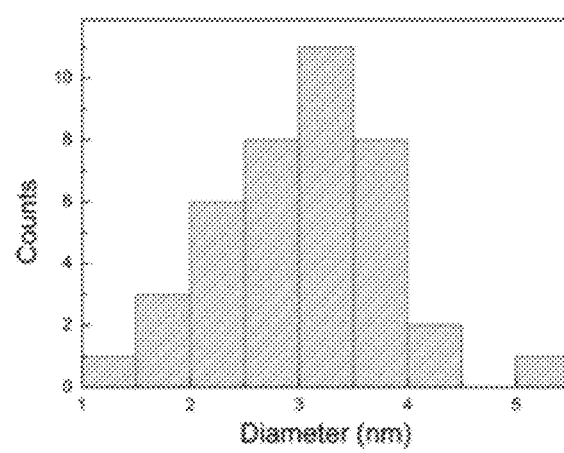

FIG. 1c shows an AFM topographic line-scan along the dashed-red line in FIG. 1a. This scan shows the diameters of the nanotubes, identified by the height variation as the tip passes over them. A similar topographic analysis of 40 different nanotubes grown on hBN shows an average diameter of 3.04 nm±0.75 nm, with the full data set presented in FIG. 1d.

The images in FIG. 1a demonstrate that the nanotubes prefer to align along three crystallographic directions of the underlying hBN lattice, similar to ones grown on few-layer graphene. To illustrate this preferred alignment we have constructed a histogram from the CNTs in FIG. 1a of nanotube length as a function of angle and plotted it in FIG. 2a. This histogram has clearly distinct peaks at angular intervals of 60°. In contrast to this alignment, there are no observable aligned nanotubes on the bare amorphous $SiO_2$ substrate. Moreover, randomly oriented hBN flakes on the same $SiO_2$ substrate have nanotubes with three preferred directions of growth, as in FIGS. 1 and 2, but which are not oriented with respect to each other. This observation indicates that no external environmental interaction (e.g., with the substrate or the gas flow) causes the nanotube growth alignment. Instead, this suggests that the aligned growth is determined by the specific crystal orientation of the underlying hBN substrate.

Figure 2A:
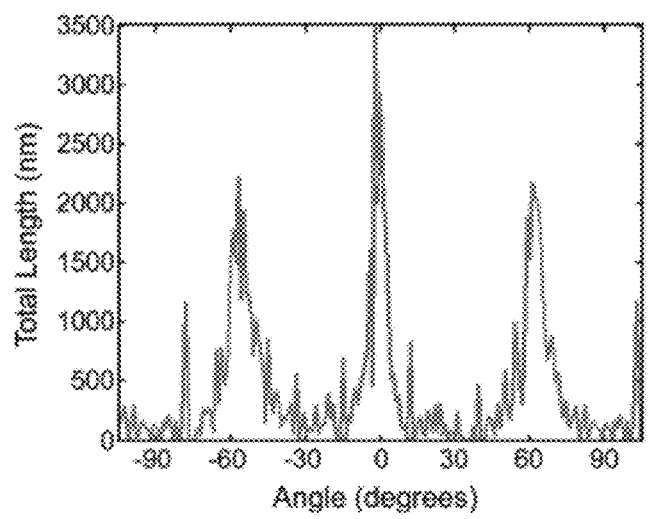
Figure 2B:
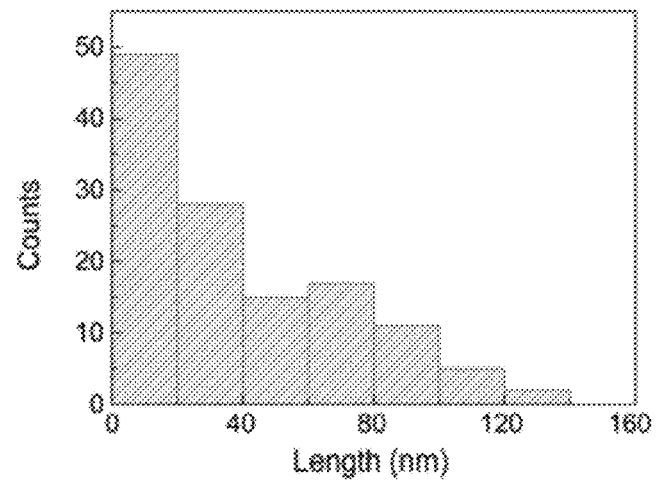

The crystallographically-oriented nanotubes we have grown typically have straight segment lengths less than ~100 nm. FIG. 2b is a histogram of the length of the aligned nanotubes used to generate FIG. 2a for those tubes that are crystallographically oriented (defined as being within 40 windows around the peaks in FIG. 2a). This selected data in FIG. 2a illustrates the short length of the crystallographically orientated nanotubes, having a calculated mean length of 60 nm±48 nm.

The nanotubes tend to align to the underlying hBN lattice through two mechanisms. One is through direct interacting with the lattice, which is evident from samples grown with relatively low $CH_4$ feedstock flows (~25 sccm) applied at early stages (~650° C.) of the upward going ramp to the final growth temperature. The application of the $CH_4$ feedstock at early stages of the ramp reduces the amount of etching, consistent with inhibited etching of graphene upon application of carbon feedstock. Under these conditions, there are considerably more nanotubes than etch tracks (as seen in the flake shown in FIG. 3a), indicating that the preferred orientations of the nanotube growth results from the direct interaction with the flat (unaltered) hBN surface.

Evidence of a second alignment mechanism is obtained from samples (like the one shown in FIG. 3b) grown at higher $CH_4$ feedstock flows (~100 sccm) that are only applied once the growth temperature of ~980° C. has been reached. Under these conditions, there is considerably more etching, likely due to the fact that it is not inhibited during the ramp up to the growth temperature. At these higher feedstock flows in the presence of greater etching, the nanotubes are seen only to align to the hBN lattice through their interactions with etch tracks, as is evident from the alignment seen in the encircled regions of FIG. 3b.

Further evidence of the differing alignment mechanisms is found through a comparison of histograms for nanotubes and etch tracks. For samples like that shown in FIG. 3a, having little etching, a histogram (shown in FIG. 3c) shows considerably longer oriented nanotubes than etch tracks. This indicates that the nanotubes must be aligning to the hBN lattice directly without need for the etch tracks. In contrast, for samples with greater etching and feedstock (as in FIG. 3b), the nanotube histogram peaks are much smaller compared to the corresponding ones of the etch tracks, as seen in FIG. 3d. This suggests that the etch tracks can play some role in improving the orientation of the nanotubes to the crystallographic axes of the hBN.

In both cases the preferred alignment of the nanotubes appears to be in the same direction as that of the etch tracks and to not be strongly dependent on the thickness of the underlying hBN. This alignment contrasts the case of CNTs grown on few-layer graphene films, which tends to be enhanced for thinner flakes (consisting of less than five layers), in directions 300 offset from the dominant etch directions and only aligned on thicker films through adhesion to etch tracks. One possibility is that defects (like the observed star-like ones) help to decouple the top few layers of the hBN, allowing it to better adhere to the nanotubes.

Figure 4A:
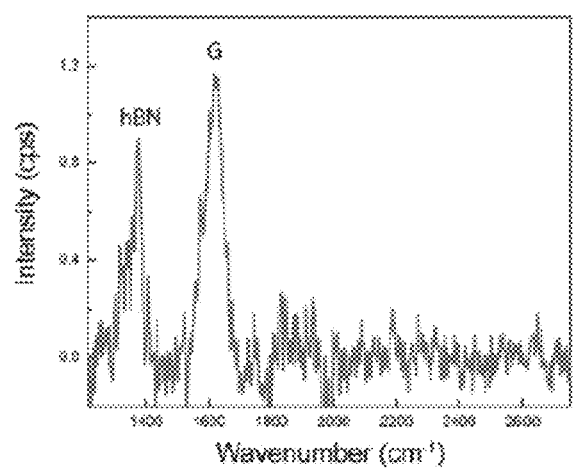

Micro-Raman spectroscopy provides evidence that we have grown a sparse coverage of carbon nanotubes (CNTs) on the hBN surfaces. A Raman spectrum taken of the surface of the sample in FIG. 1a is shown in FIG. 4a using an incident 633 nm incident laser (see the Experimental Section). We identify the first peak as that of the $E_{2g}$ mode for hBN, while the second is the G peak typical of CNTs. Since the coverage of nanotubes is relatively low, in comparison to the exposed hBN, the associated 2D signal of the CNTs is much smaller than the G peak and is not readily apparent.

Figure 4B:
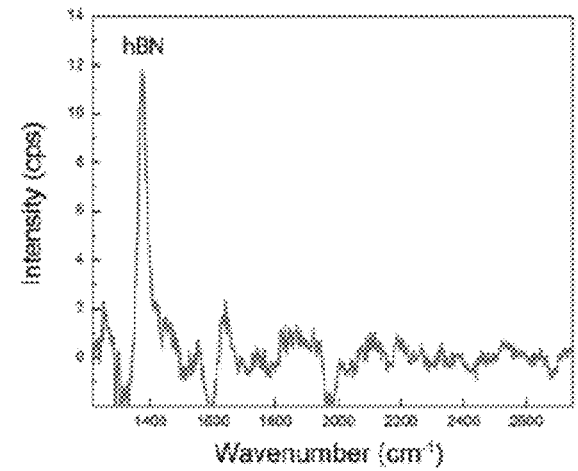
Figure 4C:
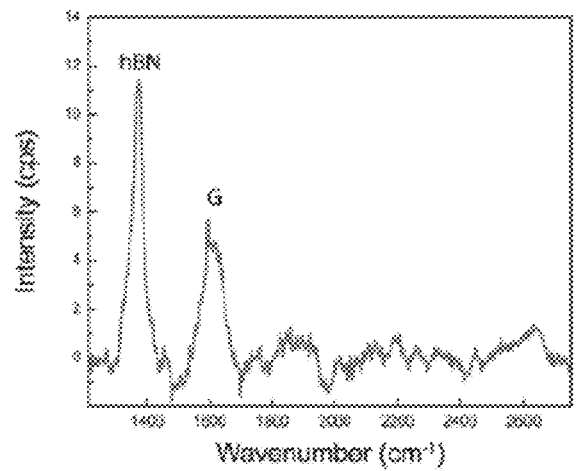
Figure 4D:
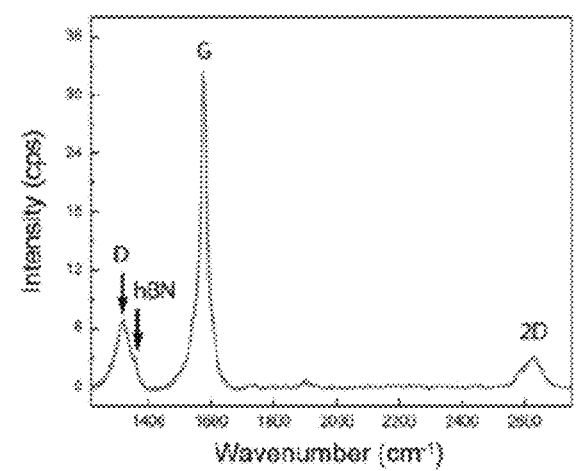

Further experimental support that the Raman spectrum in FIG. 4a is indicative of a sparse coverage of CNTs over an hBN substrate is obtained through a comparison to spectra made of several control samples. These control samples consist of hBN flakes and various amounts of CNTs deposited out of solution onto their surfaces. FIG. 4b shows the Raman spectrum of a pristine few layer hBN flake, while FIGS. 4c and 4d show the Raman spectra corresponding to the same hBN flake with increasingly greater coverage of CNTs deposited onto the surface. As the coverage of CNTs on hBN increases in going from FIG. 4c to FIG. 4d, we observe a marked increase in detector counts and improved signal/noise, indicating that the Raman scattering is increasingly dominated by the CNTs. As coverage increases there is also a corresponding change to the dominant peaks. As seen through a comparison of FIGS. 4c and 4d, by increasing the density of the CNTs, the D (~1250 $cm^{-1}$) and G (~1600 $cm^{-1}$) peaks associated with $sp^2$ carbon begin to increase in comparison to the $E_{2g}$ (~1365 $cm^{-1}$) peak for hBN. For very high CNT coverage on hBN, as in FIG. 4d, the observed dominant peaks are those associated with carbon nanotubes. At this highest coverage a well-formed 2D (~2620 $cm^{-1}$) peak of the CNTs also becomes readily observable.

The grown CNTs appear to be coupled to the hBN surface through van der Waals interactions, as is evident from nanoscale manipulation experiments. FIG. 5 shows a before-and-after AFM image taken of the same hBN region containing oriented nanotubes. The red arrow in FIG. 5a shows the path of an AFM tip dragged on the surface with a constant normal load of ~15 nN (see Experimental Section for details of the nanomanipulation investigation). This single line scan of the tip is seen in FIG. 5b to bend only one CNT, which likely remains bent because the restoring torque of the nanotube is insufficient to act against the required lateral sliding and rolling forces to restore it into its original position. This contrasts earlier work on the nanomanipulation of much larger diameter multi-walled CNTs, which are significantly stiffer and remain rigid on graphitic surfaces, rather than bend. This nanomanipulation result provides strong evidence that the CVD-grown aligned CNTs are not strongly bonded to the hBN substrate through covalent bonds. Instead, this ability to slide along the surface is typical of materials that are adhered principally through van der Waals (vdW) coupling.

Theoretical work on layered structures consisting of few-layer stacks of graphene and hexagonal boron nitride provides some insight into the possible interactions between the CNTs and the underlying hBN substrate. The roughly 0.33 nm equilibrium distances between the layers of graphite, hBN, and heterostructures consisting of these two is thought to arise principally from a competition from vdW attractions and Pauli repulsion. At this separation distance, the vdW attractions are understood to be very similar for both graphene and hBN layers. Although the electrostatic variations due to the polar bonds within hBN are significantly diminished at this distance, the small remnant potential variation as a function of position (along with Pauli repulsion) leads to preferred lower-energy stacking arrangements. It is possible that CNTs on hBN also have preferred stacking arrangements that favor certain orientations and lead to the aligned growth directions we observe, as in FIG. 1.

Figure 6A:
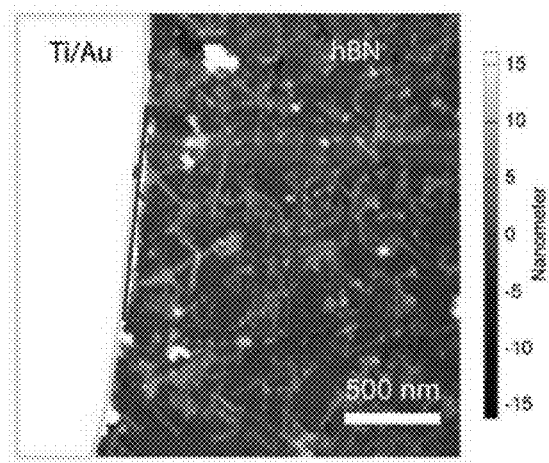
Figure 6B:
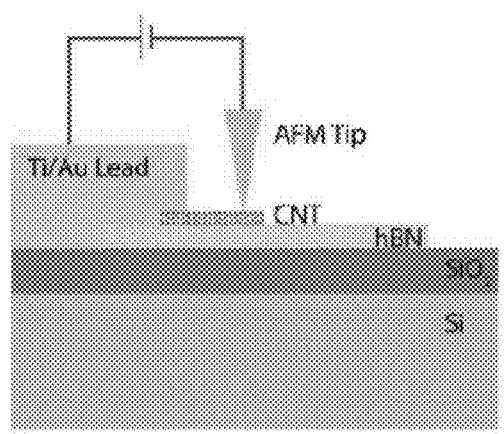
Figure 6C:
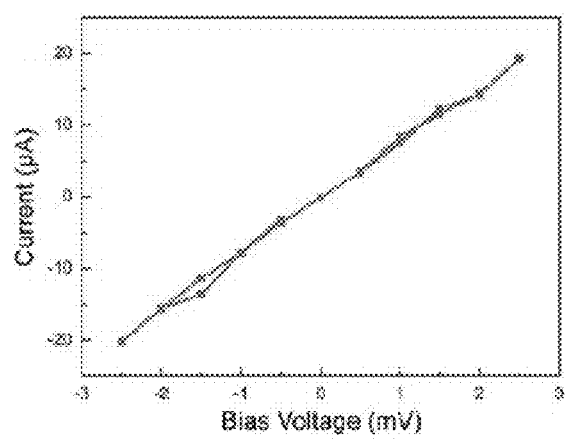
Figure 6D:
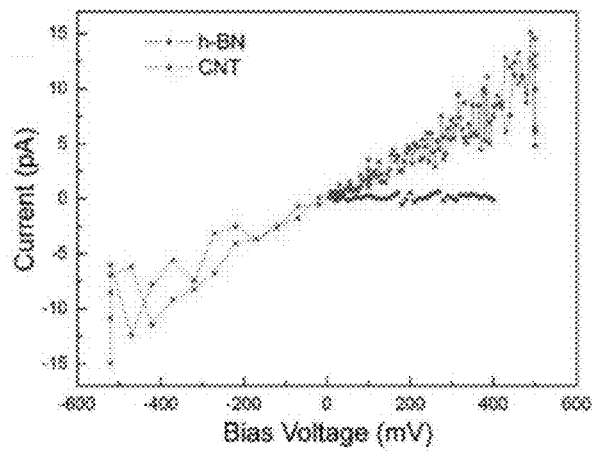

To demonstrate the contrasting material properties of the grown CNTs and the underlying hBN substrate we have performed electrical transport measurements. To achieve these measurements, 5 nm of Ti, followed by 30 nm of Au was deposited over portions of some of the nanotubes on an hBN substrate, as shown in FIG. 6a (see Experimental Section for details of the sample preparation and the electrical measurements). By biasing this gold electrode, we measured the conductance of a grown CNT on hBN by bringing a conductive AFM tip in contact with the nanotube and then measuring the current, as schematically represented by the illustration in FIG. 6b. As a reference, FIG. 6c shows the resistance of the gold lead through the AFM tip, which is approximately 130Ω. When we place the conducting AFM tip in contact within the dashed-red circle in FIG. 6a, we have been able to directly detect conductance through an aligned CNT grown on hBN. These conductance measurements through a CNT are the red-square data points shown FIG. 6d, with a two-probe resistance of ~50 GΩ. This overall high two-probe resistance for a CNT suggests that the tip-tube contact is the dominant source of electrical impedance in the circuit. We suspect that this high contact resistance is partially due to the difficulty in making a stable high-conductance electrical contact to a vdW-coupled CNT that can easily slide on the atomically flat hBN substrate (consistent with the nanomanipulation demonstrated in FIG.

5). In comparison to the electrical transport measured through the CNT, once the tip dislodges from the nanotube and is, presumably, only in contact with the hBN surface the current abruptly falls to undetectably low levels, as seen in the blue-circular data points in FIG. 6d.

To achieve further evidence of the contrasting conductive properties between the hBN and the grown CNTs without the need for direct electrical contact to the nanotubes, we have employed electrostatic force microscopy (EFM). The EFM measurements lift a conducting AFM tip a height of ~30 nm off of the surface of the hBN for each scan-line of the image (see details of technique in the Experimental Section). The tip is driven near resonance and its phase is monitored as a function of applied voltage and lateral position on the surface providing local information on the conducting properties of the sample. In the implementation of the technique that we use, referred to as "SNAP-mode", the lifted AFM tip follows a path with a fixed 30 nm vertical displacement from the linear fit to an initial pass. This SNAP-mode avoids artificial signals from capacitance variations due to topographic features, rather than the variation of the material properties.

Figure 7A:
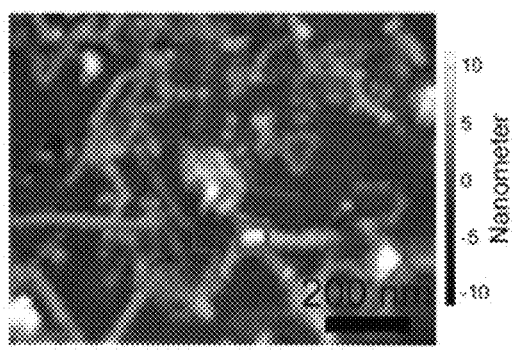
Figure 7B:
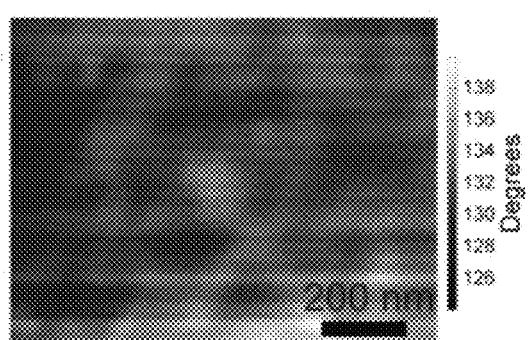
Figure 7C:
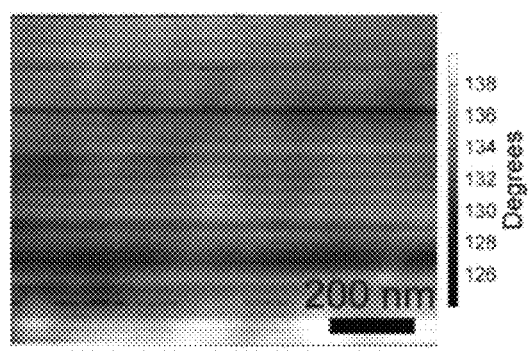
Figure 7D:
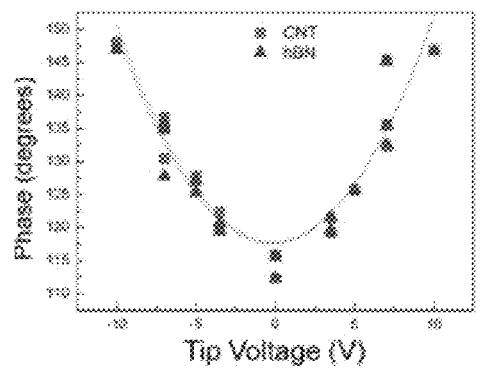

FIG. 7a shows the topography of the region within the blue box in FIG. 6a investigated with EFM. The SNAP-mode EFM measurements of this region are shown for −7 volts (FIG. 7b) and +7 volts (FIG. 7c) applied to the tip relative to the back conducting plane of the Si substrate. These EFM measurements show clear evidence of an electrical signal corresponding to locations of the sample containing CNTs. The EFM signals can be understood by focusing on two regions in FIG. 7a—the one in the thin blue box over a bare portion of hBN and the one within the thicker red box consisting of a CNT. As seen in FIG. 7d, the phase of the EFM signal as a function of the tip voltage shows a parabolic behavior for both regions. This type of parabolic behavior is well-known to be indicative of capacitive coupling of a conducting tip and a sample. Upon taking the difference of the phase for these two regions (FIG. 7e), there is a clear increase in the EFM phase signal over the CNTs, particularly at negative tip voltages. The same experiment repeated after the tip had been worn shows a diminished but still discernable increase in EFM phase response over the CNTs.

Figure 7E:
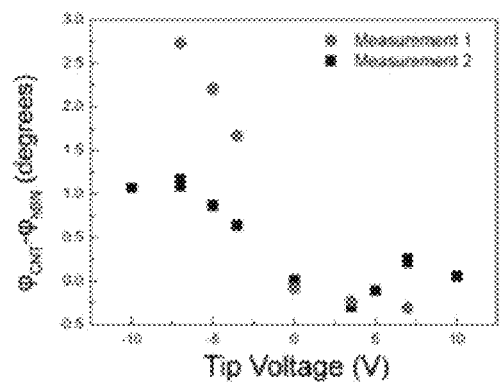
Figure 7F:
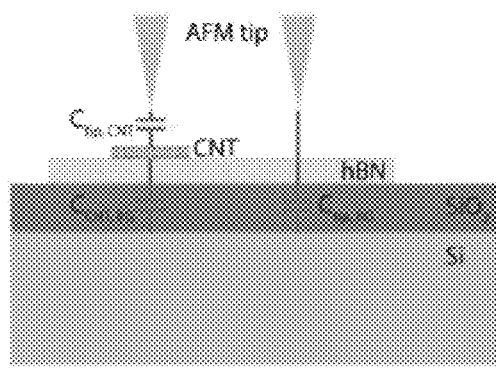

The increase in EFM phase signal over nanotubes can be understood through the schematic illustration in FIG. 7f. In this model, the more conductive CNTs (in comparison to the bare hBN substrate) add additional capacitive coupling to the back of the Si substrate, resulting in a larger phase shift over the nanotubes. These EFM results are, thus, a direct observation of the increased electrical conduction of the grown CNTs in comparison to the underlying hBN substrate.

It is possible that the asymmetry of the EFM measurements seen in FIG. 7e is due to the nanotubes being p-doped and semiconducting. While the results in FIG. 7 show evidence of increased capacitive coupling, the source of the asymmetry seen in FIG. 7e is difficult to discern and quantify since its magnitude varies with the tip (as seen by the two measurements), and the fact that the signal may also arise from an interfacial dipole layer between the nanotube and the hBN, like the one expected for interfaces between graphene and hBN.

Evidence of meander etch tracks and the formation of high-density serpentine nanotubes is presented in FIGS. 11a and 11b. Through the use a catalytic etching and nanotube growth within a single CVD processing run, we are able to obtain the meandering etch tracks and long growth required to result in a serpentine nanotube (circled in FIG. 11a). An enlarged image of this serpentine nanotube in FIG. 11b shows that it is formed within the etch tracks and has a density of long-straight segments that is about 1000 times greater than serpentine structures formed via other routes.

Overall, we have demonstrated aligned growth of vdW-coupled 1D CNTs on the layered insulating 2-D material hBN and graphite. The direct integrated growth of components consisting of contrasting material properties and dimensionalities, along with the fact that the grown CNTs have preferred orientations with respect to the underlying hBN lattice, along with high-density serpentine formation on etched layers, provides important steps to developing intricate nanoscale electrical circuits on high quality insulating substrates.

Experimental Section

Sample Preparation

To achieve the nanotube growth, we start with silicon wafers having a 300 nm $SiO_2$ coating that are cleaned by sonication in acetone, IPA and DI water followed by a UV Ozone for a 30 minute exposure in order to eliminate any remaining hydrocarbon surface contamination. Hexagonal BN flakes, purchased from HQ-Graphene, are mechanically exfoliated onto the clean silicon wafer. CVD is then used to remove tape residues from the sample by annealing the sample at 450° C. with $Ar/H_2$ (400 sccm/400 sccm). Using an electron-beam evaporator, we then deposit Ni films (having a nominal ~0.02 nm thickness, as determined by a crystal-thickness monitor) on the samples in vacuum.

CVD Parameters for CNT Growth

After Ni deposition the samples are subjected to another CVD process in order to grow CNTs. This process starts with the samples being annealed at 500° C. for 30 min with gas flow rates of 800 sccm Ar and 200 sccm $H_2$. After this step the temperature is raised at a rate of ~25-50° C./min. When the temperature reaches between 580 and 990° C., $CH_4$ is introduced with a flow rate of 15-200 sccm. The furnace is then heated to a temperature of 960-990° C. for 60-120 min to promote CNT growth.

Raman Spectroscopy Measurements

Raman spectroscopy was performed with a Horiba Jobin Yvon system consisting of an Olympus BX41 microscope and a 633 nm HeNe laser. The incident laser intensity was kept below 4 mW to avoid damaging the sample.

CNT Nanomanipulation

Nanomanipulation was performed in contact mode with an Asylum Research MFP-3D AFM using the MicroAngelo package with Budget Sensors Tap300Al-G probes.

Transport Measurements

Electrodes were fabricated with a Raith ELPHY Plus system installed on an FEI Quanta 250 SEM using standard electron beam lithography procedures. An electron beam evaporator was used to deposit 5 nm of Titanium followed by 25 nm of Au to form an electrical contact to one end of a nanotube. Electrical measurements were performed with a Keithley 6517A high resistance meter. During the electrical measurements, conductive AFM probes (Budget Sensors Tap300 GB-G) were used to make direct contact to CNTs with normal forces of ~15 nN. Two probe transport measurements of the CNTs were made between the conductive AFM probe and the lithographically defined electrode.

EFM Measurements

EFM measurements were performed with an Asylum Research MFP-3D using "SNAP" mode. In SNAP mode, an initial topography scan is made in tapping mode (intermittent contact mode). This is followed by an EFM scan where the probe is raised a fixed distance above the sample and follows the linear best-fit line of the topography scan.

During the EFM scan a voltage is applied to the probe and the phase difference between the probe and the drive frequency is measured. The probes used during EFM scans were Budget Sensors ElectriMulti75G (with Pt coating) having a nominal radius of curvature of <25 nm.

The foregoing has been presented for purposes of illustration and description. It is not intended to be exhaustive or to limit the embodiments to the precise form disclosed. Obvious modifications and variations are possible in light of the above teachings. All such modifications and variations are within the scope of the appended claims when interpreted in accordance with the breadth to which they are fairly, legally and equitably entitled.

What is claimed:

1. A method of making a nanoscale conductor/semiconductor/insulator device, comprising:

etching at least one meandering track in a substrate, said at least one meandering track including cut-atomic-step edges or trenches; and adhering at least one serpentine nanotube to the cut-atomic-step edges or trenches of the at least one meandering track in the substrate by (a) directly growing the at least one serpentine nanotube in the at least one meandering track with a catalyst particle or (b) directly depositing the at least one serpentine nanotube in the at least one meandering track by deposition process whereby orientation and meander direction of the at least one meandering track determines orientation and meander direction of the at least one serpentine nanotube.

2. The method of claim 1, including selecting said substrate layer from a group of 2-D materials consisting of dichalcogenides, hexagonal boron nitride, graphite, few-layer graphene and heterostructure mixtures thereof.

3. The method of claim 1, further including depositing a catalytically-active material on the substrate and then growing the at least one serpentine nanotube on the substrate.

4. A method of making a nanoscale conductor/semiconductor/insulator device, comprising:

placing a substrate onto a support wafer;

etching meandering tracks in a surface of the substrate; and adhering a plurality of serpentine nanotubes to cut-atomic-step edges or trenches of the meandering tracks by (a) directly growing the at least one serpentine nanotube in the at least one meandering track with a catalyst particle or (b) directly depositing the at least one serpentine nanotube in the at least one meandering track by deposition process whereby orientation and meander direction of the at least one meandering track determines orientation and meander direction of the at least one serpentine nanotube.

* * * * *